United States Patent
Dakshinamurthy et al.

(10) Patent No.: US 9,300,332 B2
(45) Date of Patent: Mar. 29, 2016

(54) WIRELESS DEVICE AND METHOD FOR PERFORMING ANTENNA TUNER UPDATES THAT MINIMIZES ADVERSE EFFECTS ON TRANSMIT AND RECEIVE CHANNELS

(71) Applicant: BROADCOM CORPORATION, Irvine, CA (US)

(72) Inventors: Sriraman Dakshinamurthy, San Jose, CA (US); Bongseok Park, Pleasanton, CA (US); Michael James Graziano, Sunnyvale, CA (US); Robert Gustav Lorenz, Menlo Park, CA (US)

(73) Assignee: BROADCOM CORPORATION, Irvine, CA (US)

( * ) Notice: Subject to any disclaimer, the term of this patent is extended or adjusted under 35 U.S.C. 154(b) by 171 days.

(21) Appl. No.: 14/138,422

(22) Filed: Dec. 23, 2013

(65) Prior Publication Data

US 2015/0155894 A1 Jun. 4, 2015

Related U.S. Application Data

(60) Provisional application No. 61/910,824, filed on Dec. 2, 2013.

(51) Int. Cl.
H04B 1/04 (2006.01)

(52) U.S. Cl.
CPC ........ *H04B 1/0458* (2013.01); *H04B 2001/045* (2013.01)

(58) Field of Classification Search
USPC .................. 455/120, 121, 123, 124, 125, 126, 455/193.1, 193.2, 193.3
See application file for complete search history.

(56) References Cited

U.S. PATENT DOCUMENTS

| | | | | |
|---|---|---|---|---|
| 5,564,086 | A * | 10/1996 | Cygan et al. .................. | 455/126 |
| 2013/0107914 | A1 * | 5/2013 | Park et al. ..................... | 375/219 |
| 2013/0188671 | A1 * | 7/2013 | Devison ........................ | 375/219 |
| 2013/0225088 | A1 * | 8/2013 | Anderson ...................... | 455/62 |
| 2013/0324057 | A1 * | 12/2013 | Zhang et al. .................. | 455/77 |

* cited by examiner

*Primary Examiner* — Blane J Jackson
(74) *Attorney, Agent, or Firm* — Garlick & Markison; Bruce E. Garlick

(57) ABSTRACT

A wireless device performs antenna tuner updates at times that minimize adverse effects on transmit and receive channels of the wireless device. The wireless device includes an antenna, an RF front end, an antenna tuner circuit and a processing module. The antenna tuner circuit is configured to substantially match a source impedance of the RF front end to a load impedance of the antenna based on a control signal. The processing module is configured to identify an update time for providing the control signal to the antenna tuner circuit that minimizes adverse effects on at least one of the transmit channel and the receive channel.

20 Claims, 10 Drawing Sheets

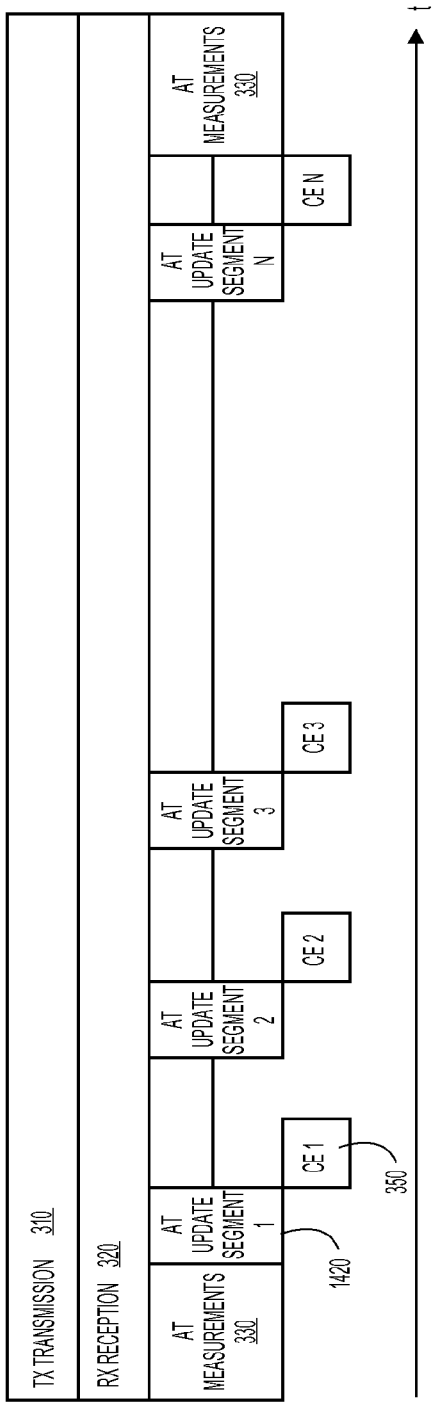
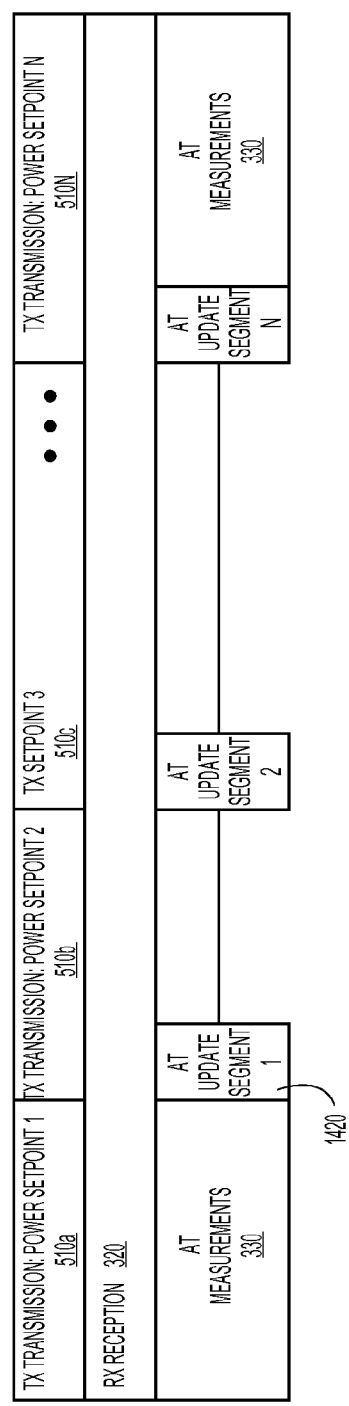
FIG. 15A
FIG. 15B

WIRELESS DEVICE AND METHOD FOR PERFORMING ANTENNA TUNER UPDATES THAT MINIMIZES ADVERSE EFFECTS ON TRANSMIT AND RECEIVE CHANNELS

CROSS REFERENCE TO RELATED APPLICATIONS

The present U.S. Utility patent application claims priority pursuant to 35 U.S.C. §119(e) to the following U.S. Provisional patent application which is hereby incorporated herein by reference in its entirety and made part of the present U.S. Utility patent application for all purposes:

1. U.S. Provisional Application Ser. No. 61/910,824, entitled "Wireless Device and Method for Performing Antenna Tuner Updates That Minimizes Adverse Effects on Transmit and Receive Channels," filed Dec. 2, 2013.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND

1. Technical Field

The present disclosure relates generally to wireless communication systems, and more particularly, to antenna tuner processes in wireless devices.

2. Description of Related Art

In a wireless communication device, a Power Amplifier (PA) is used to drive the transmit signal onto an antenna. Power Amplifiers are designed to operate using a fixed power supply source (e.g., a battery in the wireless communication device) at the maximum efficiency for both the power supply voltage and a known output load, such as 50 ohms. However, in operation, the load impedance experienced by the PA typically varies due to changing environmental conditions. Therefore, a voltage standing wave may be created between the output terminal of the PA and the antenna due to the combination of the forward and reflected powers present in the antenna. As such, the PA may experience a load that is different from the ideal 50 ohm target that the PA was designed for.

A reflection coefficient is commonly used to quantify the severity of the reflections present at the PA output. The reflection coefficient is a complex number including a magnitude component and a phase component, and varies between a magnitude of 0 and 1. A reflection coefficient of 0 indicates that the load is perfectly matched and there is no reflected energy, resulting in maximum power transfer. A reflection coefficient magnitude of 1 indicates that all of the power is reflected. In addition to the mismatch seen by the PA, this mismatch condition creates an insertion loss for the received signal, seen at the input of the receiver Low Noise Amplifier (LNA), and hence adversely affects the noise figure and sensitivity of the receive path.

In advanced transmitter architectures, an Antenna Tuner (AT) circuit is placed between the antenna and the wireless terminal. The AT circuit includes one or more programmable components that can be tuned in order to effect an impedance translation between the antenna and the PA output. This matching of the source impedance to the antenna load impedance enables maximum power transfer from the source to the load. When the source impedance is not matched to the load, some of the transmitted power is reflected away from the antenna. Properly matching the source to the antenna minimizes the power lost due to reflections, and maximizes the power delivered to the antenna (load). In addition, the use of the AT circuit can help minimize the insertion loss in the received signal, which results in an improved noise figure.

One challenge for wireless devices that use AT circuits is to adapt the AT components optimally while minimizing the impact on the transmit channel and/or receive channel. For example, the receive channel seen at the receiver can be characterized by the composite of various convolutions imparted on the received signal, starting with the transmission by the base station. The receiver estimates this composite channel and mitigates its effects. Since the AT circuit is part of this receive channel, if changes are made to the antenna tuner circuit without a corresponding re-estimation of the channel and timing, the receiver performance may degrade.

BRIEF DESCRIPTION OF THE SEVERAL VIEWS OF THE DRAWINGS

FIGS. 15A and 15B illustrate examples of timing diagrams for performing an antenna tuner update in update segments in accordance with the present disclosure.

DETAILED DESCRIPTION

Figure 1:
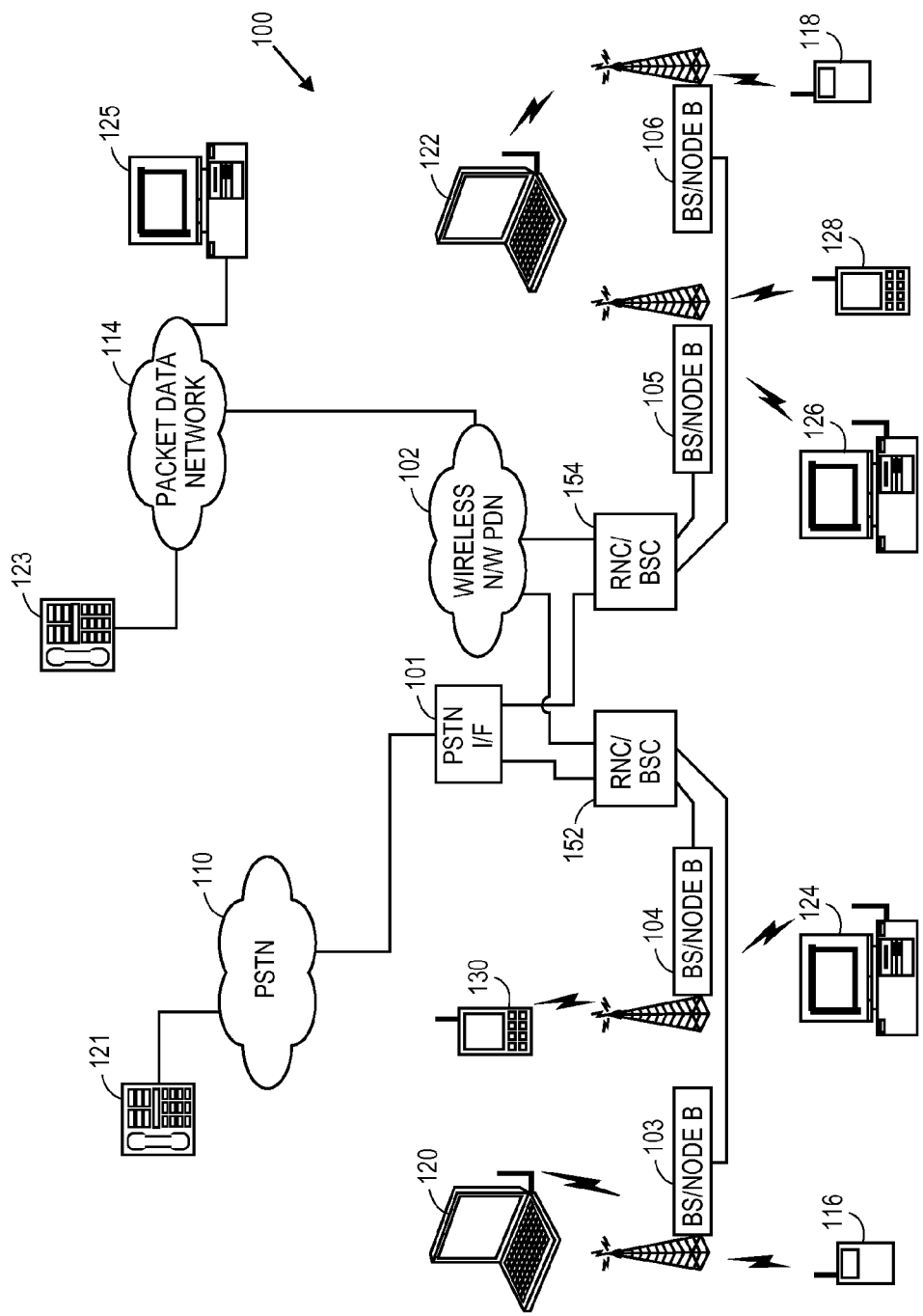
FIG. 1 illustrates an example of a portion of a communication system that supports both wired and wireless client devices in accordance with one or more embodiments of the present disclosure.

FIG. 1 illustrates an example of a portion of a communication system that supports both wired and wireless client devices in accordance with embodiments of the present disclosure. The communication system 100 includes a Public Switched Telephone Network (PSTN) Interface 101, e.g., Mobile Switching Center, a wireless network packet data network 102 that includes GPRS Support Nodes, EDGE Support Nodes, WCDMA Support Nodes, and other components, Radio Network Controllers/Base Station Controllers (RNC/BSCs) 152 and 154, and Base Stations/Node Bs/eNodeBs (hereinafter referred to as wireless network devices) 103, 104, 105, and 106. The wireless network packet data network 102 couples to additional private and public packet data networks 114, e.g., the Internet, WANs, LANs, etc. A conventional voice terminal 121 couples to the PSTN 110. A Voice over Internet Protocol (VoIP) terminal 123 and a personal computer 125 couple to the Internet/WAN 114. The PSTN Interface 101 couples to the PSTN 110. Of course, this particular structure may vary from system to system.

Each of the wireless network devices 103-106 services a cell/set of sectors and supports wireless communications therein. Wireless links that include both forward (down) link components and reverse (up) link components support wireless communications between the wireless network devices and their serviced wireless devices 116, 118, 120, 122, 124, 126, 128, and 130. These wireless links support digital data communications, VoIP communications, and other digital multimedia communications. The communication system 100 may also be backward compatible in supporting analog operations as well. The communication system 100 supports, for example, one or more of the following: the Long Term Evolution (LTE) standard, LTE-Advanced (LTE-A) standard, Mobile WiMAX standard, Wireless MAN-Advanced standard, IEEE 802.16m standard, UMTS/WCDMA standards, the Global System for Mobile telecommunications (GSM) standards, the GSM General Packet Radio Service (GPRS) extension to GSM, the Enhanced Data rates for GSM (or Global) Evolution (EDGE) standards, and/or various other OFDMA standards, CDMA standards, TDMA standards and/or FDMA standards, etc.

As illustrated, wireless devices may include cellular telephones 116 and 118, laptop computers 120 and 122, desktop computers 124 and 126, and data terminals 128 and 130. However, the cellular wireless communication system 100 supports communications with other types of wireless devices as well. The wireless devices 116-130 each include an antenna and an antenna tuner circuit configured to substantially match a source impedance of the wireless device 116-130 to a load impedance of the antenna. The wireless devices 116-130 are further configured to maintain the impedance match during operation of the wireless devices 116-10 by tuning one or more components of the antenna tuner circuit. In an embodiment, the antenna tuner circuit updates are performed at times that minimize the impact on the transmit channel and/or receive channel by exploiting non-deterministic opportunities within the particular communication standard of the wireless devices 116-130.

Figure 2:
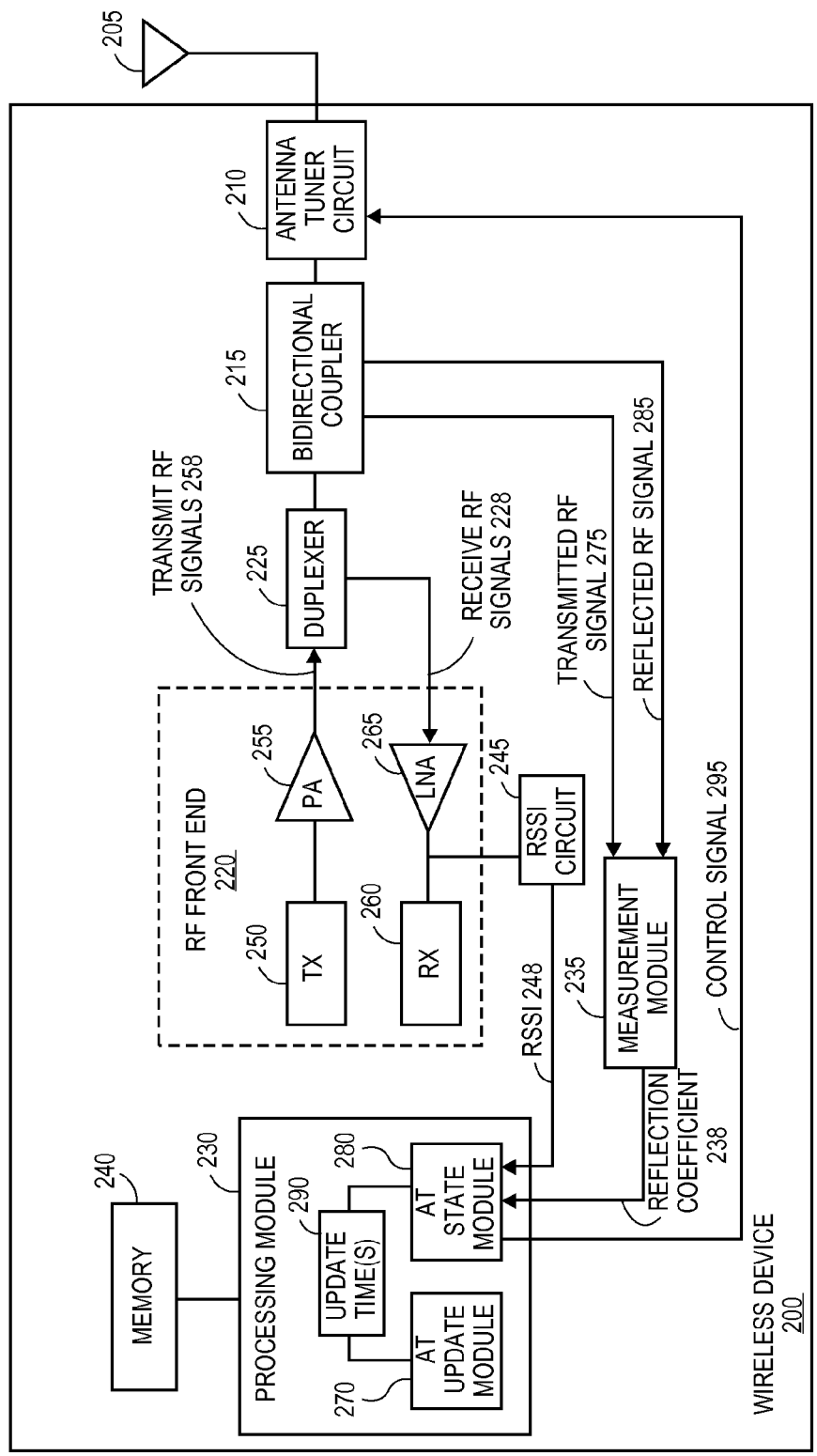
FIG. 2 illustrates an example of an embodiment of a wireless device in accordance with the present disclosure.

FIG. 2 illustrates an example of an embodiment of a wireless device 200 in accordance with the present disclosure. The wireless device 200 includes an antenna 205, an antenna tuner circuit 210, a bidirectional coupler 215, a duplexer 225, a Radio Frequency (RF) front end 220, a processing module 230 and a memory 240. The RF front end 220 includes a transmitter 250 coupled to a power amplifier 255 and a receiver 260 coupled to a low noise amplifier 265.

In an exemplary receive operation, the antenna 205 receives inbound receive RF signals and provides the receive RF signals 228 to the receiver 260 via the duplexer 225 and the low noise amplifier 265. The receiver 260 converts the receive RF signals 228 into inbound space-time or space-frequency block encoded symbol streams. For example, after amplification by the low noise amplifier 265, the receiver 260 may operate to down-convert and filter the receive RF signals to produce low IF signals or baseband signals, where the low IF is in the frequency range of zero to a few kilohertz/megahertz. The low IF or baseband signals can then be converted from the analog domain to the digital domain and input to the processing module 230 for further processing. For example, the processing module 230, in combination with operational instructions stored in memory 240, can demodulate, demap, descramble, and/or decode digital signals to recapture inbound data in accordance with the particular wireless communication standard being implemented by the wireless device 200. The path that the receive RF signals 228 traverse from the wireless network device that originated the receive RF signals 228 to the processing module 230 within the wireless device 200 is referred to herein as the "receive channel."

In an exemplary transmit operation, the processing module 230 produces outbound digital signals, which are digital baseband signals or digital low IF signals. The outbound digital signals can then be converted from the digital domain to the analog domain and provided to the transmitter 250 and power amplifier 255 to convert the analog baseband or low IF signals into one or more outbound transmit RF signals 258. For example, the transmitter 250 may operate to up-convert and filter the analog signals and the power amplifier may operate to amplify the up-converted and filtered analog signals to produce outbound transmit RF signals 258. The duplexer 225 then provides the outbound transmit RF signals 258 to the antenna 205 for transmission to a wireless network device. The path that the transmit RF signals 258 traverse from the processing module 230 within the wireless device 200 to the receiving wireless network device is referred to herein as the "transmit channel." It should be understood that the transmit and receive functions provided by the processing module 230 may be implemented using shared processing devices and/or individual processing devices.

The antenna tuner circuit 210 includes one or more programmable components, such as switches, capacitors and inductors connected in serial or parallel topology, that enable the source impedance of the RF front end (e.g., power amplifier 255) to substantially match the load impedance of the antenna 205. The state of the one or more programmable components is controlled via one or more control signals 295 provided by an antenna tuner (AT) state module 280 that is executable by the processing module 230. The AT state module 280 generates the control signal(s) 295 based on one or more parameters fed back to the AT state module 280.

In an embodiment, the AT state module 280 generates the control signal 295 based on the measured load matching between the PA 255 and the antenna 205 during a transmit operation. For example, during a transmit operation, the bidirectional coupler 215 can direct a transmitted RF signal 275 (e.g., one of the transmit RF signals 258 transmitted from the duplexer 225) and a reflected RF signal 285 reflected from the antenna 205 in response to the transmitted RF signal 275 to a measurement module 235. The measurement module 235 measures the impedance mismatch based on the transmitted RF signal 275 and the reflected RF signal 285 to produce a reflection coefficient 238 that is input to the processing module 230. The AT state module 280 determines a new antenna tuner state for the antenna tuner circuit 210 based on the reflection coefficient 238 and provides the new antenna tuner state to the antenna tuner circuit 210 in the control signal 295. The new antenna tuner state may include, for example, a respective setting for one or more of the programmable components of the antenna tuner circuit 210 to achieve the optimum impedance match.

In another embodiment, the AT state module 280 determines the new antenna tuner state based on a receiver performance metric, such as a Received Signal Strength Indication (RSSI) 248. For example, an output of the low noise amplifier 265 can be tapped and input to an RSSI circuit 245 that measures the RSSI 248 of the receive RF signals 228. The RSSI circuit 245 can then provide the measured RSSI 248 to the AT state module 280 for use in determining the new antenna tuner state. In an exemplary embodiment, when the RSSI is low, the AT state module 280 can determine a new antenna tuner state that maximizes receiver sensitivity by minimizing the insertion loss in the receive RF signals 228.

In other embodiments, the AT state module 280 determines the new antenna tuner state based on both the reflection coefficient 238 and the RSSI 248. For example, the AT state module 280 can determine the new antenna tuner state that optimizes both the transmitter impedance match and the receiver sensitivity. It should be understood that all or a portion of the measurement module 235 and the RSSI circuit 245 may be separate from or included within the processing module 230.

In an exemplary embodiment, the AT state module 280 provides the control signal 295 to the antenna tuner circuit 210 at a time that minimizes adverse effects on the transmit channel and/or receive channel, depending on the communication standard utilized by the wireless device 200. Thus, the processing module 230 further includes an AT update module 270 configured to identify one or more update time(s) 290 at which the antenna tuner circuit 210 can be updated with minimal impact on the transmit and/or receive channels. The AT update module 270 then instructs the AT state module 280 to send the control signal 295 to the antenna tuner circuit 210 at the update time(s) 290. In an embodiment, the AT update module 270 provides the update time(s) 290 to the AT state module 280, which then sends the control signal 295 to the antenna tuner circuit 210 at one or more of the update time(s), depending on whether updates to the antenna tuner state are needed. In another embodiment, the AT update module 270 sends an update instruction to the AT state module 280 at each update time 290, and upon receiving the update instruction, the AT state module 280 generates and transmits the control signal 295 to the antenna tuner circuit 210 with the current antenna tuner state, which may or may not have changed from the previous antenna tuner state.

In an embodiment in which the update time(s) 290 are selected to minimize adverse effects on both the transmit and receive channels, the AT update module 270 can set the update time(s) 290 in the transition intervals of a measurement gap when the receiver 260 is performing a frequency scan. For example, the AT update module 270 can set the update time 290 during a leading transition interval at the beginning of the measurement gap and/or during a trailing transition interval at the end of the measurement gap.

In yet another embodiment in which the update time(s) 290 are selected to minimize adverse effects on both the transmit and receive channels, the AT update module 270 can set the update time(s) 290 during a guard period between transmission of the transmit RF signals 258 and reception of the receive RF signals 228 when the wireless device 200 is operating in a time division duplexed (TDD) mode. In this embodiment, the reflection coefficient 238 can be determined during transmission of the transmit RF signals 258, and the RSSI 248 can be measured during reception of the receive RF signals 228. The antenna tuner state can then be updated during the guard period following both the transmission of the transmit RF signals 258 and reception of the receive RF signals 228 based on the measured reflection coefficient 238 and the measured RSSI 248.

In an embodiment in which the update time(s) 290 are selected to minimize adverse effects on at least the transmit channel, the AT update module 270 can set the update time(s) 290 based on transmitter power change times. For example, the AT update module 270 can set the update time 290 during the settling time after a transmitter power change is initiated.

In another embodiment in which the update time(s) 290 are selected to minimize adverse effects on at least the receive channel, the AT update module 270 can set the update time(s) 290 prior to the channel and timing estimation process performed by the receiver to ensure that any updates to the antenna tuner circuit 210 are reflected in the channel estimations made by the receiver. Since the receive channel includes the antenna tuner circuit 210, by performing any updates to the antenna tuner circuit 210 just before channel estimation, the receive channel estimation process can capture any variations in the receive channel caused by the antenna tuner update, thereby minimizing the insertion loss in the receive RF signals.

Figure 3A:
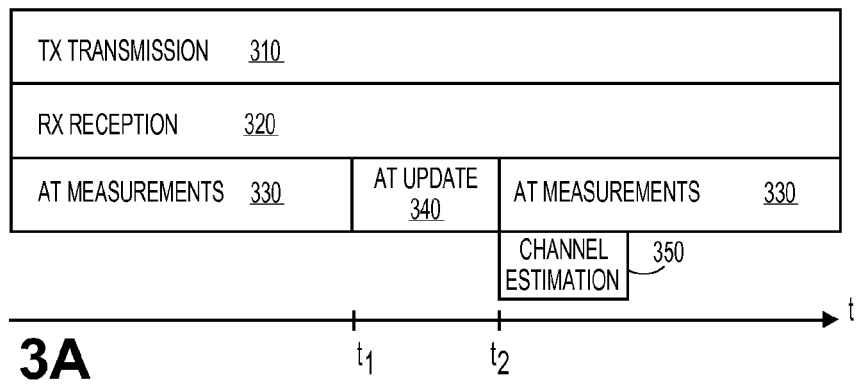
FIGS. 3A and 3B illustrate examples of timing diagrams for performing antenna tuner updates based on channel estimation times in accordance with the present disclosure.
Figure 3B:
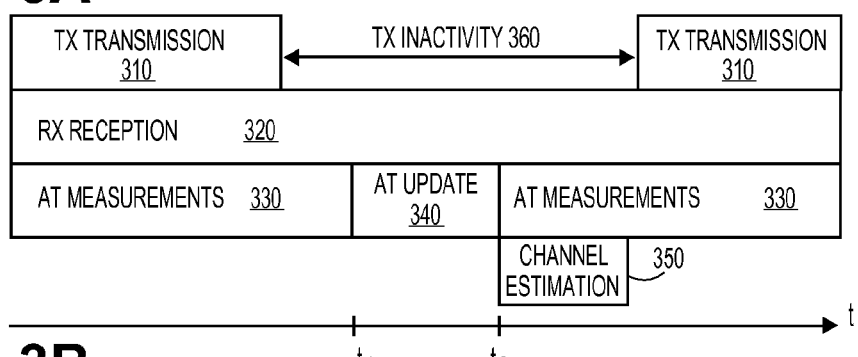

Referring now to FIGS. 3A and 3B, there are illustrated example timing diagrams for performing antenna tuner updates based on channel estimation times in accordance with the present disclosure. In FIG. 3A, the wireless device is operating in a Frequency Division Duplex (FDD) mode, such that the transmitter is transmitting (Tx transmission 310) at the same time that the receiver is receiving (Rx reception 320). Antenna tuner (AT) measurements 330 related to the Tx transmission 310 (e.g., reflection coefficients) and Rx reception 320 (e.g., RSSI measurements) can be made during the Tx transmission 310 and Rx reception 320 to enable a new antenna tuner state to be determined.

To minimize adverse effects on the receive channel, an AT update 340 can be performed prior to channel estimation 350 to enable the channel estimation process 350 to capture any changes made to the receive channel and sample timing as a result of the AT update 340. For example, as shown in FIG. 3A, the channel estimation 350 is scheduled to occur at time $t_2$. Therefore, the AT update 340 can be performed at time $t_1$, which is prior to time $t_2$.

To minimize adverse effects on both the transmit and receive channels, as shown in FIG. 3B, the AT update 340 can be performed during a period of transmitter inactivity 360 that coincides with channel estimation 350. During the Tx inactivity period 360, the transmitter is silent, such that there are no transmit RF signals transmitted during the Tx inactivity period 360. In this embodiment, the AT update 340 is still performed prior to the channel estimation 350, which minimizes the impact on the receive channel. However, since the AT update 340 occurs during the Tx inactivity period 360, there is no impact to the transmit channel as a result of the AT update 340.

Figure 4:
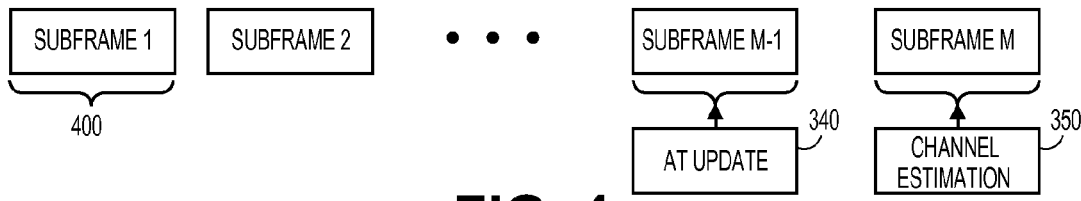
FIG. 4 illustrates an example of a subframe sequence of a receive channel in accordance with the present disclosure.

FIG. 4 illustrates an example of a subframe sequence of a receive channel in accordance with the present disclosure. As can be seen in FIG. 4, the receive channel includes a plurality of sequential subframes 400 (Subframe 1, Subframe 2 . . . Subframe M) received at the receiver. If channel estimation 350 is scheduled to occur during Subframe M, the AT update 340 can be scheduled to occur during the immediately preceding subframe (Subframe M−1). In an exemplary embodiment, the AT update 340 can be initiated at the end of Subframe M−1, so that when the channel estimation 350 occurs during Subframe M, the channel estimation 350 can capture the changes to the receive channel.

Figure 5:
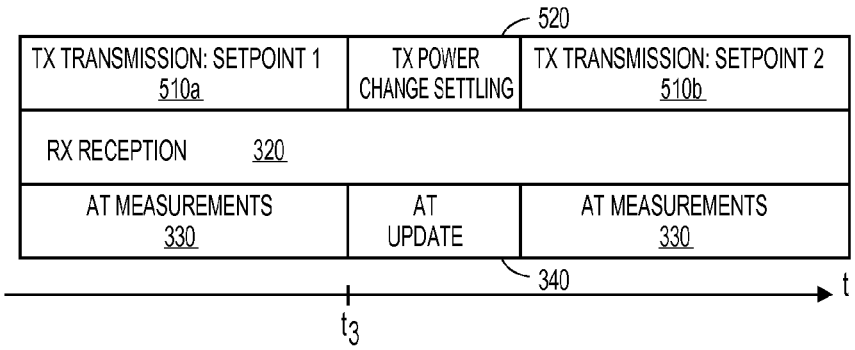
FIG. 5 illustrates an example of a timing diagram for performing an antenna tuner update based on a transmit power change time in accordance with the present disclosure.

FIG. 5 illustrates an example of a timing diagram for performing an antenna tuner update based on a transmit power change time in accordance with the present disclosure. In FIG. 5, the wireless device is again operating in FDD mode, such that the transmitter is transmitting (Tx transmissions 510a/510b) at the same time that the receiver is receiving (Rx reception 320). However, at a certain time ($t_3$), the transmit power changes from a first power set point to a second power set point. Thus, the TX transmissions 510a prior to time $t_3$ occur at the first transmit power (Power Setpoint 1), while the TX transmissions 510b after time $t_3$ occur at the second transmit power (Power Setpoint 2). A settling period 520 is typically allowed at the start of the Tx power change, during which the expected degradation during the power change is tolerated. For example, a settling time of 20 µs is allotted in the Long Term Evolution (LTE) communication standard.

Antenna tuner (AT) measurements 330 related to the Tx transmission 510a (e.g., reflection coefficients) and Rx reception 320 (e.g., RSSI measurements) are made during the Tx transmission 510a and Rx reception 320 to enable a new antenna tuner state to be determined. To minimize adverse effects on the transmit channel, the AT update 340 can be performed during the power change settling period 520. For example, as shown in FIG. 5, the AT update 340 can be initiated at time $t_3$.

Figure 6:
FIG. 6 illustrates an example of a subframe sequence of a transmit channel in accordance with the present disclosure.

FIG. 6 illustrates an example of a subframe sequence of a transmit channel in accordance with the present disclosure. As can be seen in FIG. 6, the transmit channel includes a plurality of sequential subframes 400 (Subframe 1, Subframe 2 . . . Subframe M) transmitted by the transmitter. If a transmit power change is initiated at the start of Subframe M, corresponding to time $t_3$, the AT update can also be initiated at time $t_3$ along with the power change, so that the AT update can be completed within the power change settling period.

Figure 7A:
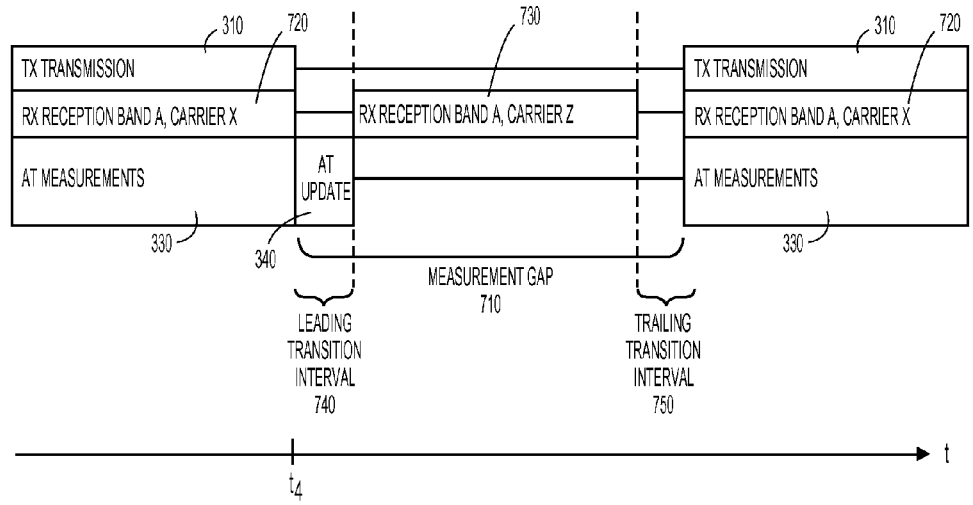
FIGS. 7A and 7B illustrate examples of timing diagrams for performing antenna tuner updates based on frequency scan times in accordance with the present disclosure.
Figure 7B:
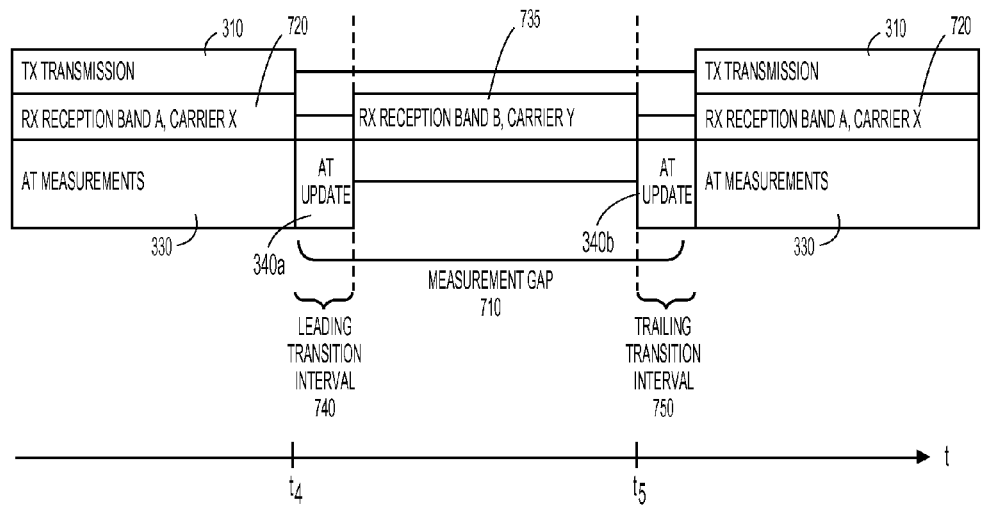

FIGS. 7A and 7B illustrate examples of timing diagrams for performing antenna tuner updates based on frequency scan times in accordance with the present disclosure. In FIGS. 7A and 7B, the wireless device is operating in FDD mode, such that TX transmissions 310 occur at the same time as Rx receptions 720. However, the wireless device temporarily interrupts the Tx transmission 310 to perform a frequency scan. The frequency scan may be an intra-band frequency scan (i.e., a scan of a frequency within the same operating band of the receiver) or an inter-band frequency scan (i.e., a scan of a frequency within a different operating band). An example of an intra-band frequency scan is shown in FIG. 7A, while an example of an inter-band frequency scan is shown in FIG. 7B.

As can be seen in FIG. 7A, during Rx reception 720, the receiver is operating in frequency band A, with a center frequency of X. At time $t_4$, the receiver discontinues Rx reception 720 to perform a frequency scan 730 of another frequency (Carrier Z) within the same frequency band (Rx Reception Band A) 730. The TX transmission 310 is also temporarily paused at time $t_4$ for a period of time corresponding to a measurement gap 710. The measurement gap 710 includes a leading transition interval 740 prior to initiation of the frequency scan 730 and a trailing transition interval 750 after completion of the frequency scan 730. For example, when measurement gaps are enabled on LTE wireless devices, leading and trailing transition intervals 740 and 750 of 250 µs are provided for frequency scans.

The AT measurements 330 taken during the Tx transmission 310 (e.g., reflection coefficients) and Rx reception 720 (e.g., RSSI measurements) are used to determine a new antenna tuner state that can then be written to the antenna tuner circuit during the AT update 340. In an embodiment, the AT update 340 can be performed during the leading transition interval 740 to minimize adverse effects on both the transmit and receive channels. For example, as shown in FIG. 7A, the AT update 340 can be initiated at time $t_4$ at the beginning of the leading transition interval 740. The new antenna tuner state can be maintained throughout the measurement gap 710, as well as when the receiver switches back to the original carrier frequency X. In another embodiment, the AT update 340 can be performed during the trailing transition interval 750.

During an inter-band frequency scan, as can be seen in FIG. 7B, the receiver is operating in frequency band A, with a center frequency of X. At time $t_4$, the receiver discontinues Rx reception 720 to perform a frequency scan 735 of another frequency (Carrier Y) within a different frequency band (Rx Reception Band B) 735. The TX transmission 310 is also temporarily paused at time $t_4$ for the measurement gap time period 710.

Since the Rx frequency band has changed, the antenna tuner state found during the AT measurement 330 period for Rx Reception Band A may not be optimal for Rx Reception Band B. Therefore, the antenna tuner state for Carrier Y in Rx Reception Band B may be retrieved from a look-up table of antenna tuner state values indexed per band and/or frequency. The antenna tuner state determined for Carrier Y can then be written to the antenna tuner circuit during an AT update 340a performed within the leading transition interval 740. For example, the AT update 340a for Carrier Y, Frequency Band B can be initiated at time $t_4$ at the beginning of the leading transition interval 740.

After the frequency scan 735 is completed, the new antenna tuner state (determined as a result of the AT measurements 330) for Carrier X, Frequency Band A can be written to the antenna tuner circuit during another AT update 340b performed during the trailing transition interval 750. For example, as shown in FIG. 7B, the AT update 340b can be initiated at time $t_5$ at the beginning of the trailing transition interval 750 and prior to switching back to the original frequency (Carrier X, Frequency Band A). Since both AT updates 340a and 340b are performed during the measurement gap 710, adverse effects on both the transmit and receive channels can be minimized.

Figure 8:
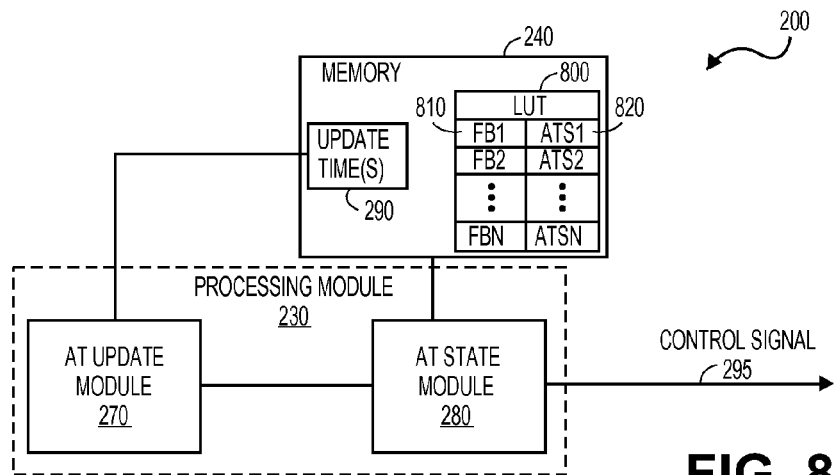
FIG. 8 illustrates an example of an operation of a processing module within a wireless device for performing an antenna tuner update during a frequency scan in accordance with the present disclosure.

FIG. 8 illustrates an example of an operation of a processing module 230 within a wireless device 200 for performing an antenna tuner update during a frequency scan in accordance with the present disclosure. The processing module 230 includes the AT update module 270 and AT state module 280. The AT update module 270 and AT state module 280 may each operate using one or more algorithms (sets of instructions) executable by the processing module 230. The instructions may be hard coded into the processing module 230 and/or stored within a memory device 240 accessible to the processing module 230. The memory 240 may further include antenna tuner update time(s) 290 determined by the AT update module 270 and a golden look-up table (LUT) 800 including respective antenna tuner states 820 (ATS1, ATS2 . . . ATSN) for each of a plurality of frequency bands 810 (FB1, FB2 . . . FBN). In another embodiment, the LUT 800 may further include respective antenna tuner states for each of a plurality of frequencies within each frequency band.

In embodiments in which the wireless device 200 is configured to perform inter-band frequency scans during measurement gaps, the AT update module 270 is configured to set the antenna tuner circuit update time(s) 290 to the start of the leading and trailing transition intervals of the measurement gaps. The AT state module 280 is configured to generate the control signal 295 including a new antenna tuner state determined from the LUT 800 or based on one or more parameters fed back to the AT state module 280 at the update times 290. For example, at the beginning of a leading transition interval, the AT update module 270 can instruct the AT state module 280 to index the LUT 800 based on the scanned frequency band 810 and/or scanned frequency to retrieve the antenna tuner state 820 for the scanned frequency band 810 and/or scanned frequency and then send the retrieved antenna tuner state to the antenna tuner circuit in the control signal 295. As another example, at the beginning of a trailing transition interval, the AT update module 270 can instruct the AT state module 280 to generate and send the new antenna tuner state for the current operating frequency band and/or frequency as determined based on AT measurements (e.g., reflection coefficients and/or RSSI measurements) to the antenna tuner circuit in the control signal 295.

Figure 9A:
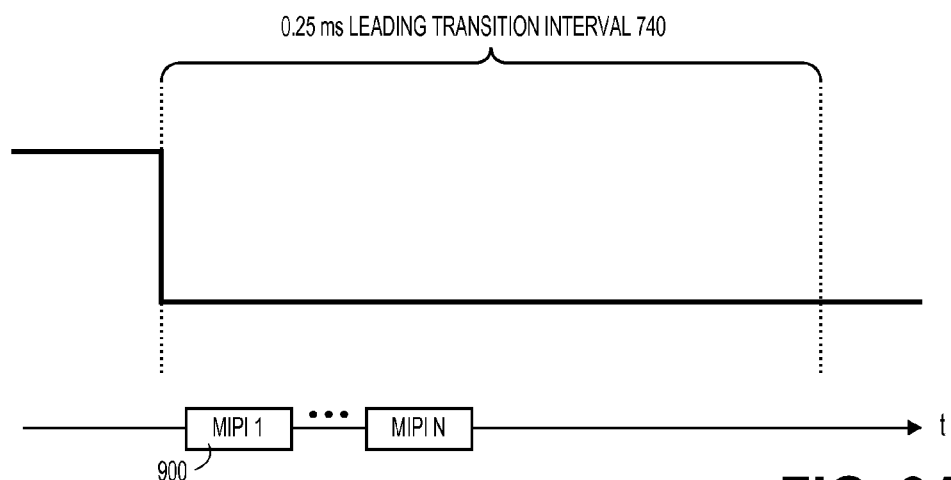
FIGS. 9A and 9B illustrate examples of timing diagrams for performing antenna tuner updates during transition intervals of frequency scans in accordance with the present disclosure.
Figure 9B:
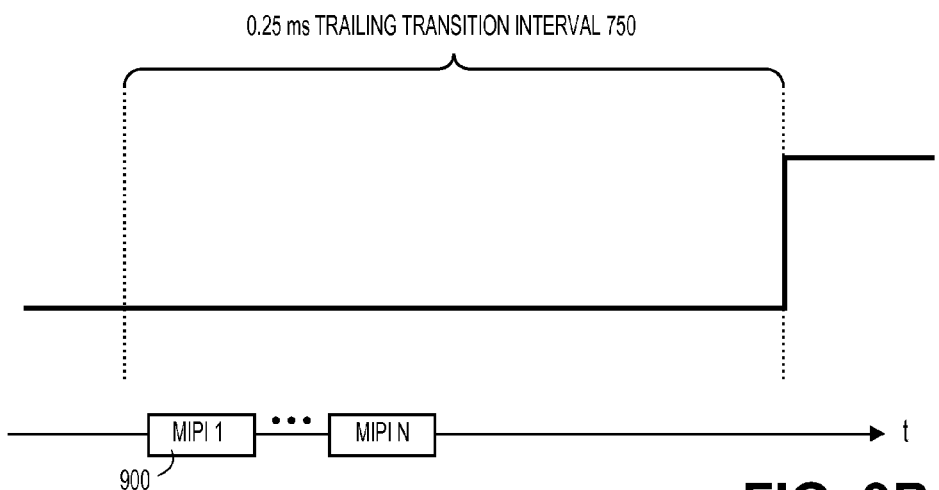

FIGS. 9A and 9B illustrate examples of timing diagrams for performing antenna tuner updates during transition intervals of frequency scans in accordance with the present disclosure. FIG. 9A illustrates a leading transition interval 740, while FIG. 9B illustrates a trailing transition interval 750. In each of FIGS. 9A and 9B, the control signal providing the antenna tuner updates for the antenna tuner circuit includes one or more Mobile Industry Processor Interface (MIPI) commands 900 (MIPI1 . . . MIPIN). Each MIPI command 900 includes a setting for at least one programmable component of the antenna tuner circuit. The MIPI commands 900 are initiated during the respective transition intervals 740 and 750 and conclude prior to the end of the transition intervals 740 and 750 to minimize adverse effects on the transmit and receive channels. It should be understood that other communication protocols may be used to facilitate communication with the antenna tuner circuit, and the present disclosure is not limited to MIPI.

Figure 10:
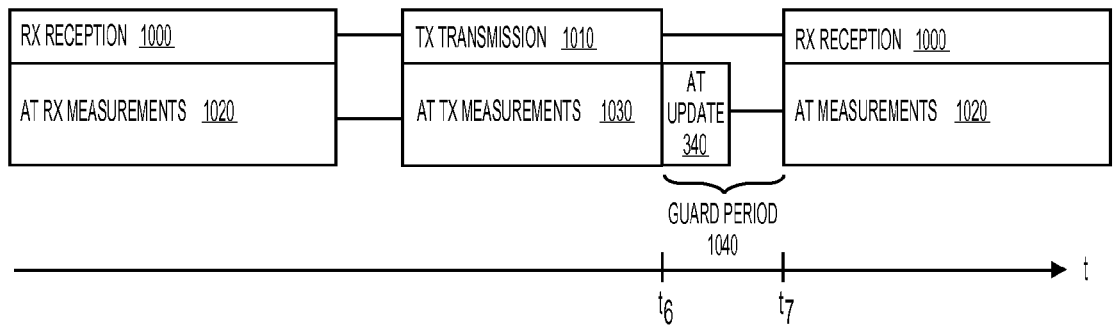
FIG. 10 illustrates an example of a timing diagram for performing an antenna tuner update in a time division duplexed (TDD) mode of the wireless device in accordance with the present disclosure.

FIG. 10 illustrates an example of a timing diagram for performing an antenna tuner update in a time division duplexed (TDD) mode of the wireless device in accordance with the present disclosure. As can be seen in FIG. 10, the wireless device is operating in a TDD mode, such that the transmitter and receiver are operating at different times. Thus, Rx receptions 1000 occur at different times than Tx transmissions 1010. Antenna tuner (AT) measurements 1020 related to the Rx reception 1000 (e.g., RSSI measurements) are made during the Rx reception 1000, and AT measurements 1030 related to the Tx transmission 1010 (e.g., reflection coefficients) are made during the Tx transmission 1010. The new antenna tuner state can then be determined based on one or both of the Tx and Rx AT measurements 1020 and 1030.

To minimize adverse effects on both the transmit and receive channels, the AT update 340 can be made during the transition period (guard period 1040) between Tx transmission 1010 and Rx reception 1000. For example, as shown in FIG. 10, the guard period 1040 occurs between times $t_6$ and $t_7$. Therefore, the AT update 340 can be initiated at time $t_6$ (or anytime between $t_6$ and $t_7$). In an embodiment in which the wireless device is an LTE device, the guard period is 20 μs. Although not shown, it should be understood that the next AT update 340 can be scheduled to occur following additional Rx and Tx AT measurements 1020 and 1030, and such scheduling can be repeated indefinitely.

Depending on the AT measurements 1020 and 1030, the AT update 340 can be configured to optimize one or both of the receiver sensitivity (e.g., RSSI) and the transmitter impedance matching. For example, in one embodiment, when the transmit power is low, the new antenna tuner state can be set to optimize the receiver sensitivity (e.g., optimize the RSSI). In another embodiment, when both the transmit and receive powers are high, the new antenna tuner state can be set to optimize the transmitter impedance matching. In yet another embodiment, when the transmit power is high, but the receive power is low, the new antenna tuner state can be set to optimize both the receiver sensitivity and the transmitter impedance matching.

Figure 11:
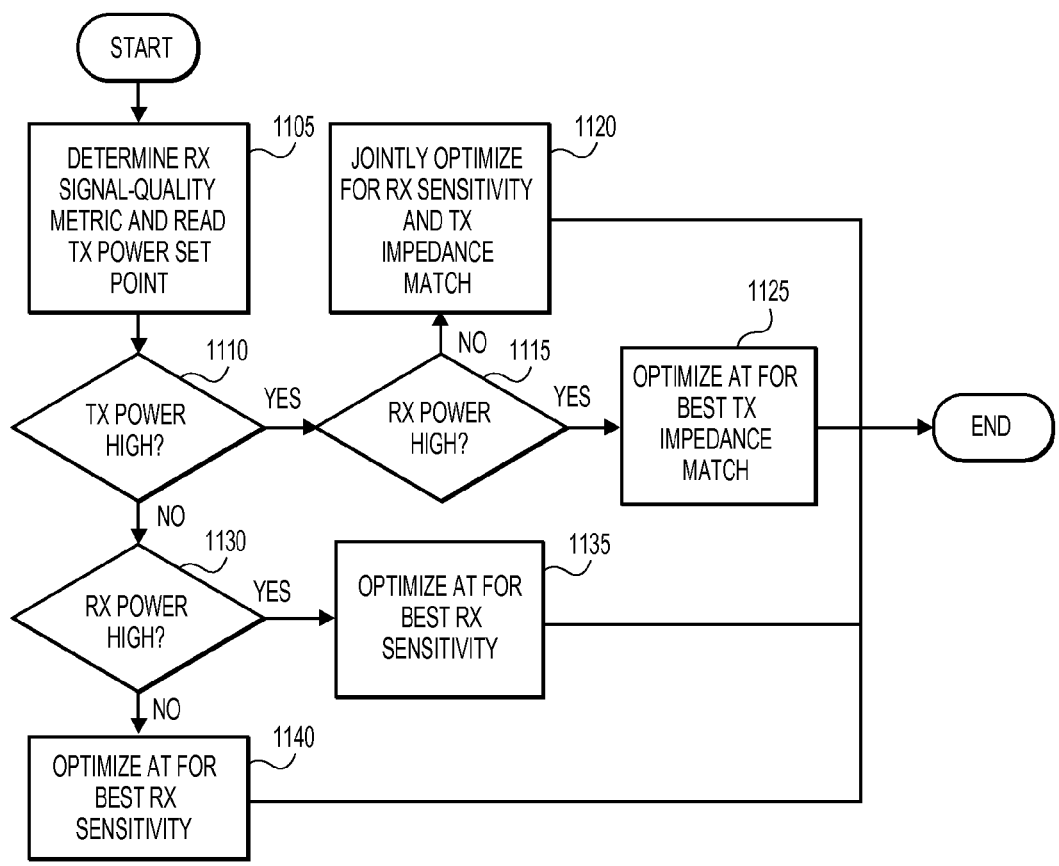
FIG. 11 illustrates an example of a method for performing an antenna tuner update that optimizes both the transmitter and receiver performance of a wireless device in accordance with the present disclosure.

FIG. 11 illustrates an example of a method for performing an antenna tuner update that optimizes both the transmitter and receiver performance of a wireless device in accordance with the present disclosure. The method begins at 1105, where a receiver signal quality metric, such as the RSSI, is determined and the transmit power set point is also determined. At 1110, a determination is made whether the transmit power is high (e.g., above a threshold transmit power). If so, at 1115, a determination is made whether the receive power is high (e.g., above a threshold receive power). If the transmit power is high, but the receive power is low, at 1120, the antenna tuner state that optimizes both the transmitter impedance matching and receiver sensitivity is determined as the new antenna tuner state for the antenna tuner circuit. If both the transmit and receive powers are high, at 1125, the antenna tuner state that optimizes the transmitter impedance matching is determined as the new antenna tuner state for the antenna tuner circuit.

If the transmit power is low, at 1130, a determination is made whether the receive power is high. If so, at 1135, the antenna tuner state that optimizes the receiver sensitivity is determined as the new antenna tuner state for the antenna tuner circuit. If both the transmit and receive powers are low, at 1140, the antenna tuner state that optimizes the receiver sensitivity is determined as the new antenna tuner state for the antenna tuner circuit.

Figure 12:
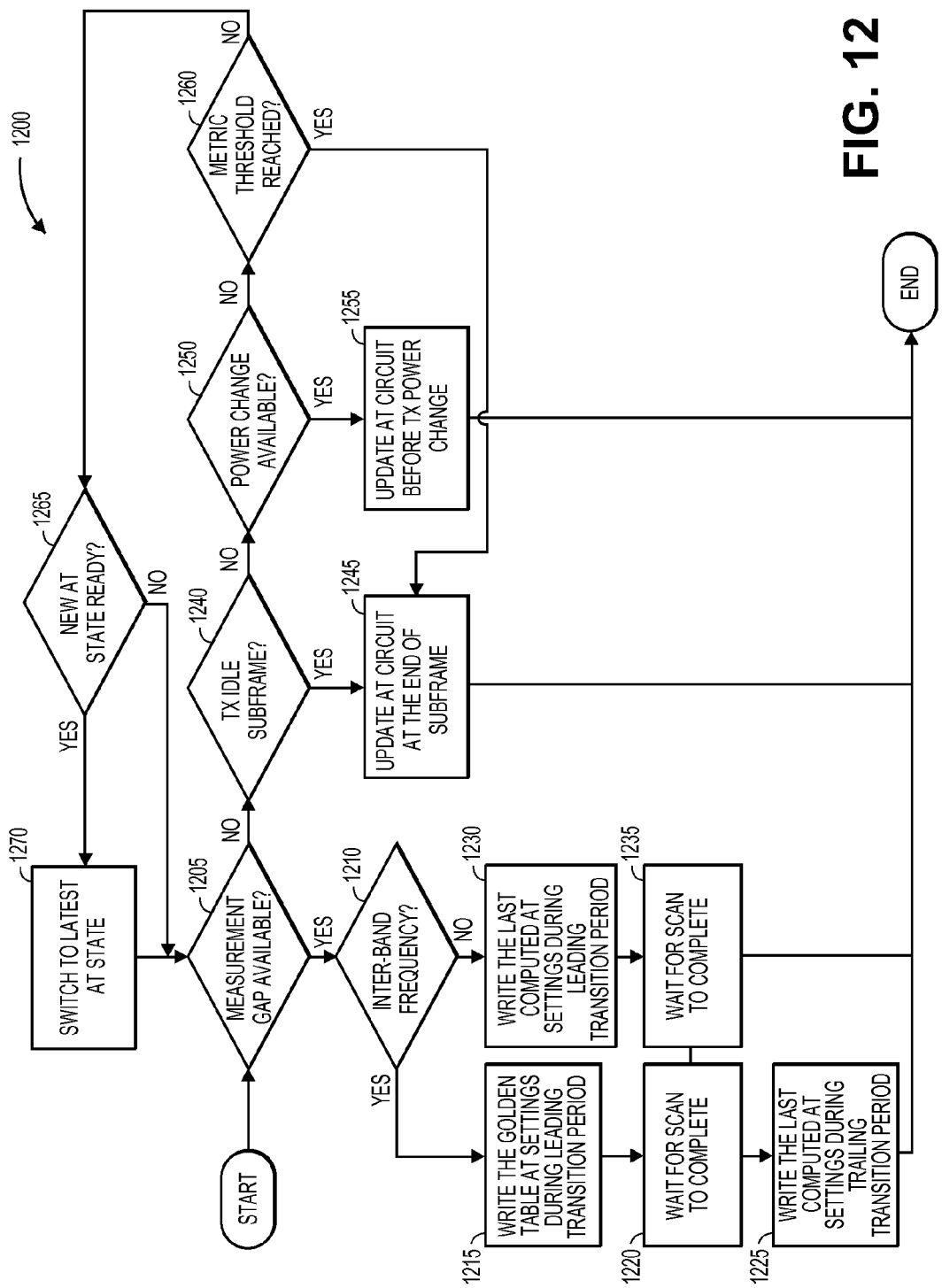
FIG. 12 illustrates an example of a method for performing antenna tuner updates that minimizes adverse effects on signal processing in accordance with the present disclosure.

FIG. 12 illustrates an example of a method 1200 for performing antenna tuner updates that minimizes adverse effects on signal processing. The method begins at 1205, where a determination is made whether a measurement gap is available (i.e., the wireless device is scheduled to perform a frequency scan). If so, at 1210, a determination is made whether the frequency scan is an inter-band frequency scan. If so, at 1215, the golden LUT antenna tuner state settings are written to the antenna tuner circuit during the leading transition period of the measurement gap. Then, at 1220 and 1225, once the frequency scan is completed, the last computed antenna tuner state settings for the current operating frequency band are written to the antenna tuner circuit during the trailing transition period of the measurement gap. If the frequency scan is an intra-band frequency scan, at 1230, the last computed antenna tuner state settings for the current operating frequency band are written to the antenna tuner circuit during the leading transition period of the measurement gap, and at 1235, the new antenna tuner state setting are maintained during the frequency scan and after the frequency scan is completed.

If there are no measurement gaps occurring, at 1240, a determination is made whether the transmitter is scheduled to be idle during the current subframe. If so, at 1245, the antenna tuner circuit can be updated with a new antenna tuner state at the end of the idle transmitter subframe. In one embodiment, the idle transmitter subframe occurs prior to channel estimation by the receiver. If transmitter is not scheduled to be idle during the current subframe, at 1250, a determination is made whether a transmit power change is scheduled to occur. If so, at 1255, the antenna tuner circuit is updated during the power change settling period of the power change.

If a power change is not available, at 1260, a determination is made whether a metric threshold has been reached. The metric threshold may be, for example, an RSSI threshold or a transmitter impedance matching threshold. The threshold may be used to determine when significant changes in impedance matching and/or RSSI necessitate that an antenna tuner circuit update should occur. If the metric threshold has been reached or exceeded, at 1245, the antenna tuner circuit is updated at the end of the current subframe.

If the metric threshold has not been reached and there was no available time to perform an AT update in any of the previous decision blocks 1205, 1240 or 1250, at 1265, a determination is made whether a new antenna tuner state is ready. If so, at 1270, the new antenna tuner state is utilized when determining whether an antenna tuner update should be performed as the process is repeated at 1205. If not, the current antenna tuner state is utilized as the process is repeated at 1205.

Figure 13:
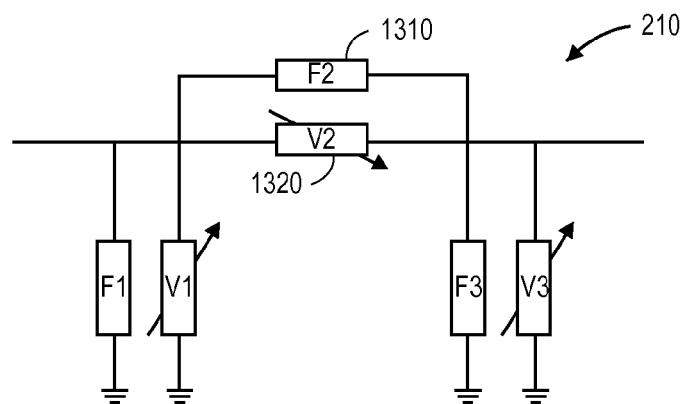
FIG. 13 illustrates an example of an embodiment of an antenna tuner circuit in accordance with the present disclosure.

FIG. 13 illustrates an example of an embodiment of an antenna tuner circuit 210 in accordance with the present disclosure. The antenna tuner circuit 210 includes a plurality of internal and/or external fixed devices 1310 (F1, F2 and F3), and a plurality of programmable devices 1320 (V1, V2 and V3). The programmable devices 1320 may include, for example, switches, capacitors and inductors connected in serial or parallel topology. A state change of the antenna tuner circuit 210 may involve changing one or more of the programmable devices 1320. For example, the state change may include changing the settings of one or more switches and/or capacitors. In one embodiment, the changes to the individual programmable devices 1320 are made simultaneously. In another embodiment, the changes to the individual programmable devices 1320 are made at different times, such that the overall state of the antenna tuner circuit 210 is gradually moved to the new state to avoid large sudden changes to the transmit and/or receive channels. For example, the changes can be broken into update segments, with each update segment imparting a portion of the overall state change. In one embodiment, each of the update segments includes changes to different ones of the programmable devices 1320. In another embodiment, the changes to each programmable device 1320 are broken down into small incremental adjustments, and each update segment includes an incremental adjustment to one or more of the programmable devices 1320.

Figure 14:
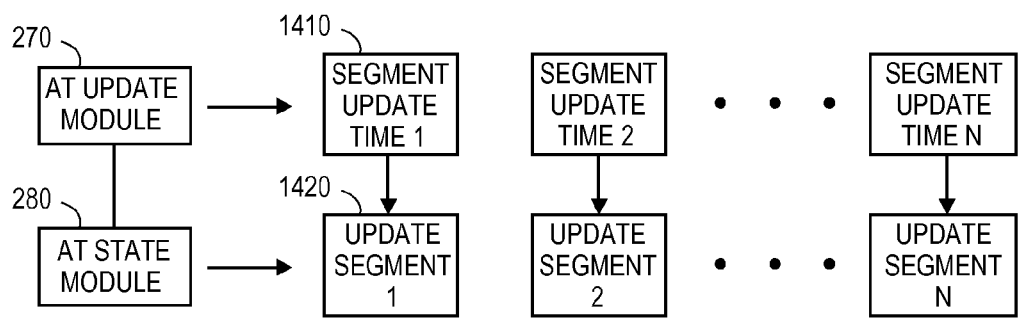
FIG. 14 illustrates an example of an operation of a processing module within a wireless device for determining update segments of an antenna tuner update in accordance with the present disclosure.

FIG. 14 illustrates an example of an operation of a processing module within a wireless device for determining update segments of an antenna tuner update in accordance with the present disclosure. As can be seen in FIG. 14, the AT state module 280 determines a plurality of update segments 1420 (Update Segment 1, Update Segment 2 ... Update Segment N), each including a respective change to one or more of the programmable components of the antenna tuner circuit. For example, in one embodiment, the update segments 1420 are designed such that each update segment updates different ones of the programmable components. In another embodiment, each update segment 1420 includes an incremental adjustment to one or more programmable components, such that changes to the same programmable component can be made gradually and in a controlled manner over two or more update segments 1420. For each update segment 1420, the AT update module 270 determines a corresponding segment update time 1410 (Segment Update Time 1, Segment Update Time 2 ... Segment Update Time N). Each segment update time 1410 can be set to minimize adverse effects on one or both of the transmit and receive channels.

FIGS. 15A and 15B illustrate examples of timing diagrams for performing an antenna tuner update in update segments in accordance with the present disclosure. In FIG. 15A, the AT update segments 1420 are scheduled to occur prior to channel estimation 350 times in the receiver. For example, AT Update Segment 1 occurs in the subframe immediately prior to Channel Estimation (CE) 1, AT Update Segment 2 occurs in the subframe immediately prior to CE2 and so on. After the last AT update segment (AT Update Segment N), the AT measurements 330 (Tx and/or Rx) are resumed to determine a new antenna tuner state.

In FIG. 15B, the AT update segments 1420 are performed at the time a power change occurs. For example, AT Update Segment 1 occurs when the transmit power changes from Power Setpoint 1 510a to Power Setpoint 2 510b, AT Update Segment 2 occurs when the transmit power changes from Power Setpoint 2 510b to Power Setpoint 3 510c and so on. After the last AT update segment (AT Update Segment N), which occurs when the transmit power changes to Power Setpoint N 510N, the AT measurements 330 (Tx and/or Rx) are resumed to determine a new antenna tuner state.

Figure 16:
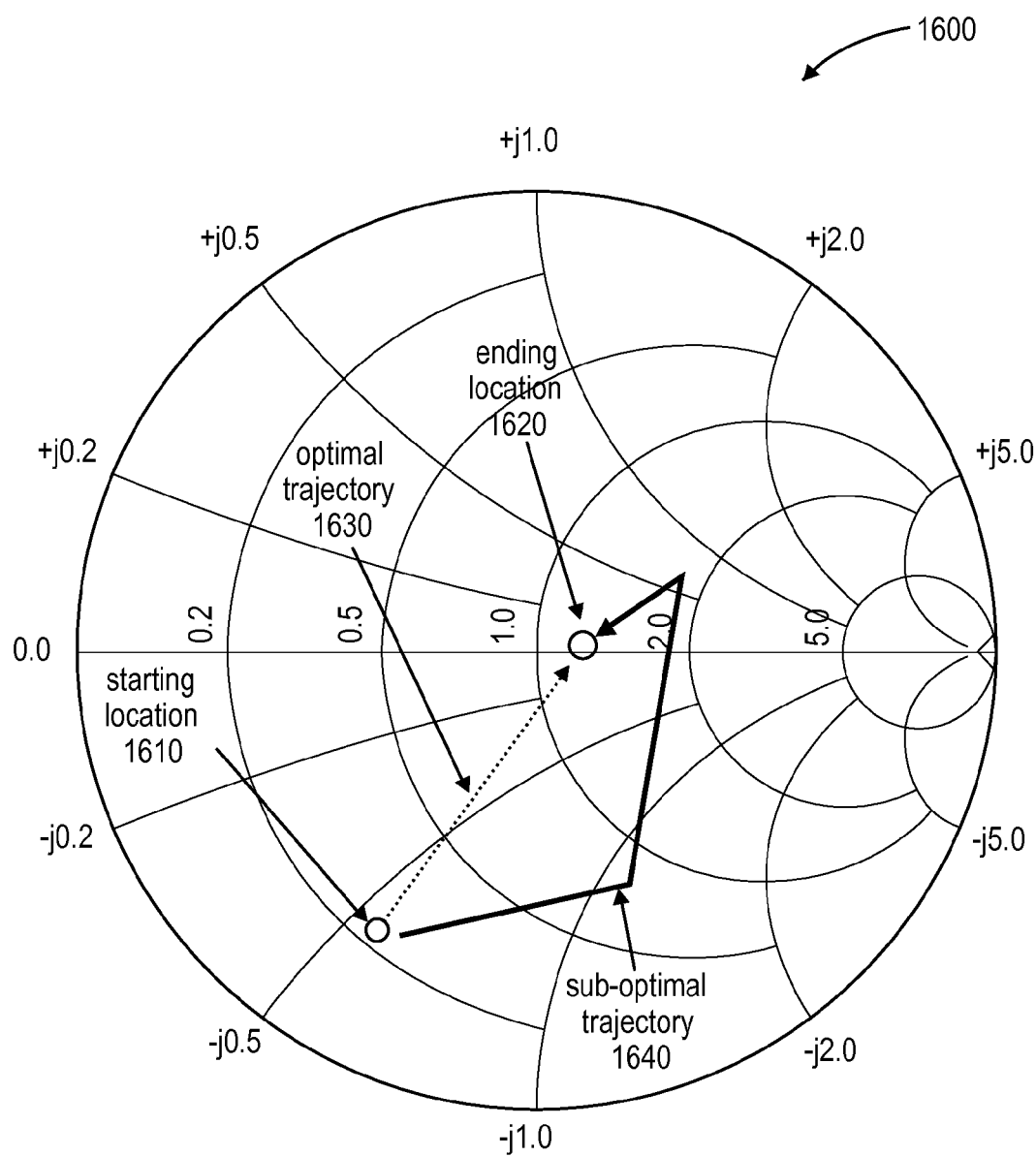
FIG. 16 illustrates an example of antenna tuner update trajectories in accordance with the present disclosure.

FIG. 16 illustrates an example of antenna tuner update trajectories in accordance with the present disclosure. FIG. 16 is a Smith chart 1600 that graphically expresses the value of the reflection coefficient in a complex plane such that both the real (resistance) and imaginary (reactance) values are shown in the form of circles. The starting location 1610 represents the antenna impedance before matching with the antenna tuner circuit, and the ending location 1620 represents the antenna impedance matching when the optimal (new) antenna tuner state is configured. The dotted line represents the optimal trajectory 1630 for updating the antenna tuner state from the starting location 1610 to the ending location 1620, whereas the solid line represents a sub-optimal trajectory 1640 for updating the antenna tuner state from the starting location 1610 to the ending location 1620. In both the optimal trajectory 1630 and sub-optimal trajectory 1640, changes to individual programmable components are made over time in update segments. However, in the optimal trajectory 1630, the update segments are structured so that each of the programmable components is gradually changed in a controlled manner over several periodic writes to the antenna tuner circuit. By contrast, in the sub-optimal trajectory 1640, the update segments are structured to make gross changes to the programmable components, such as performing the full update on one component before making any changes to another component. As can be seen in FIG. 16, the optimal trajectory 1630 can be more closely tracked when small incremental adjustments are made to all components over time, until the full adjustment is made.

As may be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

The term "module" is used in the description of one or more of the embodiments. A module includes a processing module, a functional block, hardware, and/or software stored on memory for performing one or more functions as may be described herein. Note that, if the module is implemented via hardware, the hardware may operate independently and/or in conjunction with software and/or firmware. As also used herein, a module may contain one or more sub-modules, each of which may be one or more modules.

In addition, the terms "processing module" and "processor" may be a single processing device or a plurality of processing devices. Such a processing device may be a microprocessor, micro-controller, digital signal processor, microcomputer, central processing unit, field programmable gate array, programmable logic device, logic circuitry, analog circuitry, digital circuitry, and/or any device that manipulates signals (analog and/or digital) based on hard coding of the circuitry and/or operational instructions. The processing module and/or processor may further have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that if the processing module and/or processor implements one or more of its functions via analog circuitry, digital circuitry, and/or logic circuitry, the memory and/or memory element storing the corresponding operational instructions may be embedded within, or external to, the circuitry comprising the analog circuitry, digital circuitry, and/or logic circuitry. Still further note that, the memory element may store, and the processing module and/or processor executes, hard coded and/or operational instructions corresponding to at least some of the steps and/or functions described herein. Such a memory device or memory element can be included in an article of manufacture.

One or more embodiments of an invention have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

While particular combinations of various functions and features of the present disclosure have been expressly described herein, other combinations of these features and functions are likewise possible. The present disclosure is not limited by the particular examples disclosed herein and expressly incorporates these other combinations.

What is claimed is:

1. A wireless device comprising:
    an antenna configured to transmit and receive Radio Frequency (RF) signals;
    an RF front end including a transmitter for providing transmit RF signals to the antenna via a transmit channel and a receiver for receiving receive RF signals from the antenna via a receive channel;
    an antenna tuner circuit coupled to the antenna and the RF front end, the antenna tuner circuit being configured to substantially match a source impedance of the RF front end to a load impedance of the antenna based on a control signal; and
    a processing module configured to:
        determine a transmit power of the transmitter and a receive power of the receiver; and
        identify an update time for providing the control signal to the antenna tuner circuit that minimizes adverse effects on at least one of the transmit RF signals and the receive RF signals based on the transmit power and the receive power; and
        generate and transmit the control signal to the antenna tuner circuit at the identified update time to perform an update to the antenna tuner circuit.

2. The wireless device of claim 1 further comprising:
    a measurement module configured to measure a difference between a transmitted RF signal and a reflected RF signal reflected from the antenna to determine a reflection coefficient; and
    the processing module further configured to:
        determine a new antenna tuner state based on the reflection coefficient; and
        include the new antenna tuner state in the control signal to perform the update to the antenna tuner circuit.

3. The wireless device of claim 2 further comprising:
    the processing module further configured to:
        determine a performance metric for the receiver during reception of the receive RF signals by the receiver;
        determine the new antenna tuner state based on the reflection coefficient and the performance metric;
        determine a guard period between transmission of the transmit RF signals by the transmitter and reception of the receive RF signals by the receiver; and
        set the update time during the guard period.

4. The wireless device of claim 1 further comprising:
the processing module further configured to:
identify a channel estimation start time at which the processing module begins performing a channel estimation for the receiver; and
set the update time prior to the channel estimation start time.

5. The wireless device of claim 4, wherein the channel estimation start time occurs during a first subframe and the update time occurs during a second subframe immediately prior to the first subframe.

6. The wireless device of claim 4, wherein the update time occurs during a period of inactivity of the transmitter.

7. The wireless device of claim 1 further comprising:
the processing module further configured to:
identify a power change start time at which the processing module begins performing a power change of the transmitter; and
set the update time to the power change start time.

8. The wireless device of claim 1 further comprising:
the antenna tuner circuit includes a plurality of programmable components;
the update to the antenna tuner circuit includes update segments, each of the update segments including a respective change to at least one of the plurality of programmable components; and
the processing module further configured to:
identify a respective segment update time for each of the update segments; and
perform each of the update segments at the respective segment update time.

9. The wireless device of claim 1 further comprising:
the processing module further configured to:
identify a measurement gap during which a frequency scan is performed by the receiver, the measurement gap including a leading transition interval at a beginning of the measurement gap and a trailing transition interval at an end of the measurement gap; and
perform the update during at least one of the leading transition interval and the trailing transition interval.

10. The wireless device of claim 9 wherein the frequency scan is an inter-band frequency scan of a scanned frequency band different than an operating frequency band of the receiver, and further comprising:
a memory including a look-up table of antenna tuner states and corresponding frequency bands;
the processing module further configured to:
index the look-up table based on the scanned frequency band to determine a new antenna tuner state for the scanned frequency band;
include the new antenna tuner state in the control signal to the antenna tuner circuit during the leading transition interval;
index the look-up table based on the operating frequency band to determine an original antenna tuner state for the operating frequency band; and
include the original antenna tuner state in the control signal to the antenna tuner circuit during the trailing transition interval.

11. The wireless device of claim 9, wherein the frequency scan is an intra-band frequency scan of a scanned frequency within a same frequency band as an operating frequency of the receiver, and further comprising:
the processing module further configured to set the update time to a beginning of the leading transition interval.

12. The wireless device of claim 1, wherein the update time comprises a time at which data is not being carried by the transmit RF signals or the receive RF signals.

13. A non-transitory memory device having accessible therefrom a set of instructions interpretable by at least one processing module, the set of instructions comprising:
instructions for identifying an update time for providing a control signal to an antenna tuner circuit that minimizes adverse effects on at least one of transmit channel for transmitting transmit Radio Frequency (RF) signals by a transmitter of a wireless device and a receive channel for receiving receive RF signals by a receiver of the wireless device, the antenna tuner circuit coupled to an antenna of a wireless device and configured to substantially match a source impedance of the transmitter to a load impedance of the antenna;
instructions for generating and transmitting the control signal to the antenna tuner circuit at the identified update time to perform an update to the antenna tuner circuit;
instructions for identifying a channel estimation start time at which the processing module begins performing a channel estimation for the receiver; and
instructions for setting the update time prior to the channel estimation start time.

14. The non-transitory memory device of claim 13, wherein the set of instructions further comprising:
instructions for determining a reflection coefficient for the transmitter during transmission of the transmit RF signals by the transmitter based on a difference between a transmitted RF signal and a reflected RF signal reflected from the antenna;
instructions for determining a performance metric for the receiver during reception of the receive RF signals by the receiver;
instructions for determining a new antenna tuner state for the antenna tuner circuit based on the reflection coefficient and the performance metric;
instructions for determining a guard period between transmission of the transmit RF signals by the transmitter and reception of the receive RF signals by the receiver;
instructions for setting the update time during the guard period; and
instructions for including the new antenna tuner state in the control signal transmitted to the antenna tuner circuit at the update time.

15. The non-transitory memory device of claim 13, wherein the set of instructions further comprising:
instructions for identifying a power change start time at which a power change of the transmitter begins; and
instructions for setting the update time to the power change start time.

16. The non-transitory memory device of claim 13, wherein the set of instructions further comprising:
instructions for identifying a measurement gap during which a frequency scan is performed by the receiver, the measurement gap including a leading transition interval at a beginning of the measurement gap and a trailing transition interval at an end of the measurement gap; and
instructions for performing the update during at least one of the leading transition interval and the trailing transition interval.

17. The non-transitory memory device claim 13, wherein the set of instructions further comprises:
instructions for determining a transmit power of the transmitter and a receive power of the receiver; and
instructions for determining the update time that minimizes adverse effects on at least one of the transmit RF signals and the receive RF signals based on the transmit power and the receive power.

18. The non-transitory memory device of claim 13, wherein the update time comprises a time at which data is not being carried by the transmit RF signals or the receive RF signals.

19. A method for updating an antenna tuner circuit coupled to an antenna of a wireless device, comprising:
- identifying an update time for providing a control signal to the antenna tuner circuit that minimizes adverse effects on at least one of a transmit channel for transmitting transmit Radio Frequency (RF) signals by a transmitter of the wireless device and a receive channel for receiving receive RF signals by a receiver of the wireless device, the antenna tuner circuit configured to substantially match a source impedance of the transmitter to a load impedance of the antenna;
- generating and transmitting the control signal to the antenna tuner circuit at the identified update time to perform an update to the antenna tuner circuit;
- identifying a measurement gap during which a frequency scan is performed by the receiver, the measurement gap including a leading transition interval at a beginning of the measurement gap and a trailing transition interval at an end of the measurement gap; and
- performing the update during at least one of the leading transition interval and the trailing transition interval.

20. The method of claim 19, wherein the update time comprises a time at which data is not being carried by the transmit RF signals or the receive RF signals.

* * * * *